United States Patent [19]
Anderson

[11] Patent Number: 5,581,747
[45] Date of Patent: Dec. 3, 1996

[54] COMMUNICATION SYSTEM FOR PROGRAMMABLE DEVICES EMPLOYING A CIRCUIT SHIFT REGISTER

[75] Inventor: Jeffrey Anderson, Minneapolis, Minn.

[73] Assignee: Starkey Labs., Inc., EdenPrairie, Minn.

[21] Appl. No.: 348,923

[22] Filed: Nov. 25, 1994

[51] Int. Cl.$^6$ ............................... G06F 1/04; H04R 25/00
[52] U.S. Cl. ................................................ 395/551; 381/68
[58] Field of Search ............................... 395/550; 381/68, 381/68.1–68.7, 69, 69.1, 69.2

[56] References Cited

U.S. PATENT DOCUMENTS

| | | | |
|---|---|---|---|
| 4,570,215 | 2/1986 | Miura et al. | 395/550 X |
| 4,972,487 | 11/1990 | Mangold et al. | 381/68 |
| 4,989,251 | 1/1991 | Mangold | 381/68 X |

Primary Examiner—Thomas M. Heckler
Attorney, Agent, or Firm—Jay H. Maioli

[57] ABSTRACT

An interface system for communicating between a programmable device, such as a hearing assisting device, and a programmer unit employs a circular shift register and a memory. Upon initialization the memory contents are loaded in the circular shift register and cycled through so that each bit is exposed to the programmer unit for verification or change. After a complete cycle through the shift register the program is fed back to the memory where it is used to control the transfer function of the hearing assisting device. By use of this circular shift register only two connections to the programmer unit are required, thereby minimizing the mechanical size of the connector needed to connect the programmer unit to the hearing assisting device, which may be an in the ear device. A low voltage version of the interface system uses current sources and a high voltage version of the interface system, such as used for a remote controller, uses impedances and a voltage source.

5 Claims, 4 Drawing Sheets

COMMUNICATION SYSTEM FOR PROGRAMMABLE DEVICES EMPLOYING A CIRCUIT SHIFT REGISTER

BACKGROUND OF THE INVENTION

1. Field of the Invention

The present invention relates generally to a system for communicating commands and the like to a programmable device and, more particularly, to a system for receiving a programming signal for use in programming a hearing assisting device.

2. Description of the Related Art

With the advent of integrated circuits and digital technology, it has become possible to program a circuit or device to function in various desired ways. For example, digital filters and signal processors can be programmed with various parameters to provide a desired transfer function, even though the digital signal processor itself is rather generic. Application of this programming technique is found in many different branches of electronic apparatus, for example, in hearing assisting devices.

Upon utilization of the presently available solid state technology, a hearing assisting device can be designed generically and then programmed to meet the requirements of each individual. Such programming typically takes place initially after the manufacturing of the hearing assisting device, although the device may be reprogrammed subsequently to meet the changing needs of the individual.

Another advance in the progress of hearing assisting devices has been the miniaturization that is possible due to these integrated circuit developments. This has resulted in a popular hearing assisting device being so small as to be located in the ear of the individual. While this has certain cosmetic advantages, the problem then is that is becomes difficult to connect the hearing assisting device to the programming apparatus, due to the size constraints placed on the connector system.

In addition, because a goal is to make the hearing assisting device be as flexible as possible from the standpoint of programming various parameters and the like into the system, the trend has been to include more and more semiconductor elements, typically in the form of integrated circuits, into the hearing assisting device. This has a countervailing effect in that the device tends to become bigger in order to render it more generic or flexible from the proramming standpoint.

OBJECTS AND SUMMARY OF THE INVENTION

Accordingly, it is an object of the present invention to provide a communication system for programmable devices that can eliminate the above-noted defects inherent in the previously proposed systems.

Another object of this invention is to provide an improved communication system for programmable devices in which the programming information can be transmitted efficiently and without the requirement for complex electronics located in the programmable device.

A further object of this invention is to provide a communication system for a programmable device in which a minimum number of electrical connections are required, thereby reducing the mechanical space requirements necessary on the actual programmable device.

In accordance with an aspect of the present invention, a communication system for a programmable device is intended to be located inside the programmable device and requires only two electrical connections for performing the programming operation. In addition, the communication system does not require a circuit for locking onto the input data rate but, rather, is an asynchronous system in which the programmer unit recovers the clock signal from the programmable device that receives the clock signal from the hearing assisting device. The communication from the programmer unit can also interrogate the programmable device to make certain that the programming signals are suited for the device to be programmed.

The above and other objects, features, and advantages of the present invention will become apparent from the following detailed description of illustrative embodiments thereof to be read in conjunction with the accompanying drawings.

BRIEF DISCLOSURE OF THE DRAWINGS

DETAILED DESCRIPTION OF PREFERRED EMBODIMENTS

Figure 1:
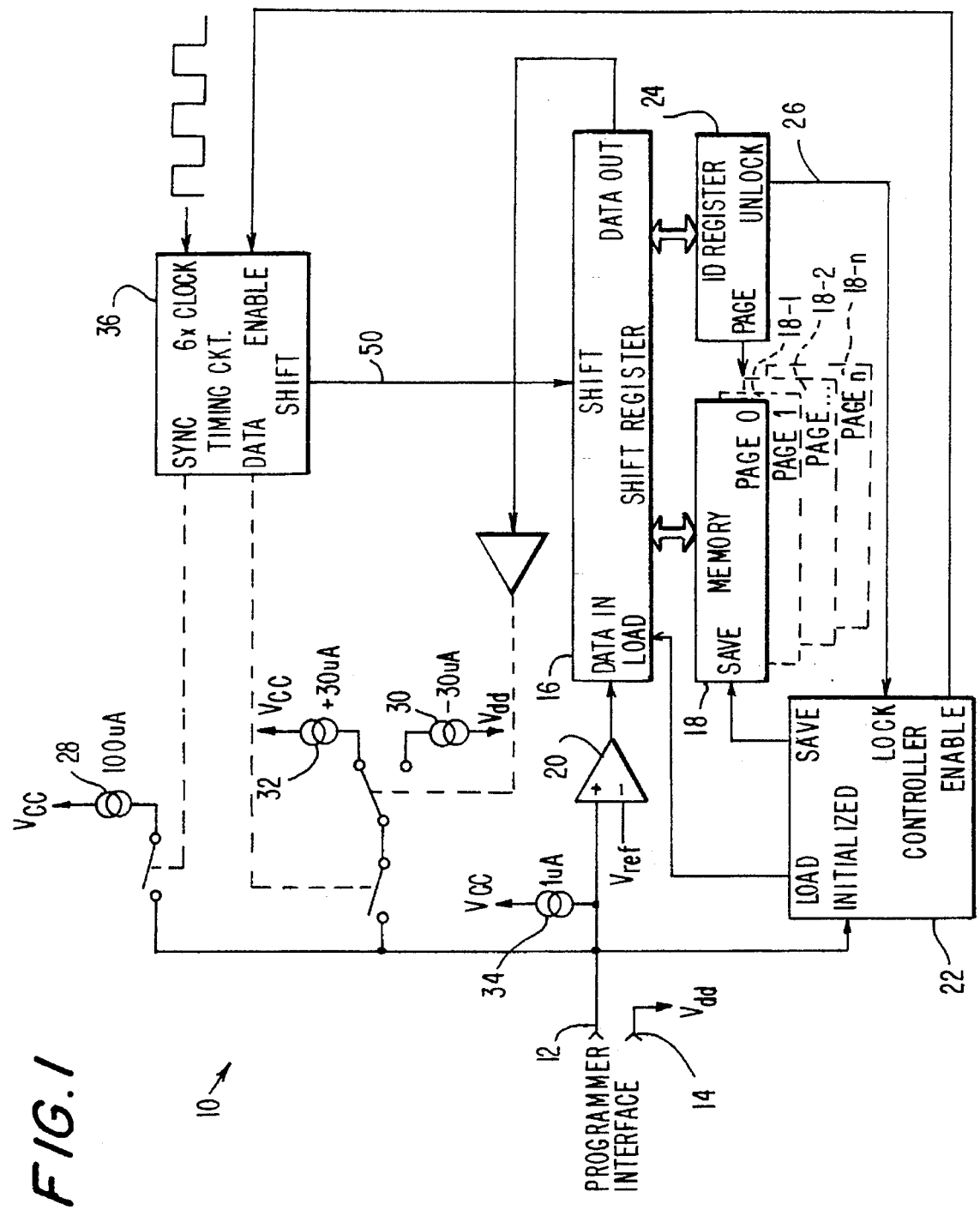
FIG. 1 is a schematic in block diagram form of a first embodiment of a communication system for a programmable device according to the present invention.

FIG. 1 shows a system 10 comprising an embodiment of the present invention that is intended to reside within or become incorporated in the programmable device, which in this case comprises an assistive listening system. In the embodiment of FIG. 1 only two electrical connections 12 and 14 are required for connection to the programmer interface, which comprises a cable or the like fed to the programmer device (not shown), which may be a microprocessor based system for communicating with the system 10 shown in FIG. 1. Central to this embodiment is a circular data buffer or shift register 16. A memory 18 is provided that can include up to sixteen memory pages or commands. Each of these memory pages may have a size from one to 64 bits. These pages are represented by the broken lines 18-1, 18-2, ... 18-n. The memory 18 and shift register 16 are controlled by a controller 22 that is connected to the input terminal 12 through a comparator 20 that acts as a data discriminator or level detector for the signal from the programmer unit. More specifically the reference voltage $V_{ref}$ connected to the comparator 20 can be selected as ½ Vcc, with the result being that any input signal from the programmer unit that is above ½ Vcc is output from the comparator 20 as a logic "1" and any input signal that is below ½ Vcc is determined by the comparator 20 to be a "0".

The present invention provides for an identification system so that the programmer unit can identify the device being programmed and therefore provide the appropriate programming signals. An identification (ID) register 24 contains information concerning the particular kind of integrated circuit that is employed in the hearing assisting device and what specific kind of device or product is being programmed. When the appropriate data from the programmer unit is fed to the shift register 16, which is in communication with the ID register 24, and the device is properly identified, then the ID register 24 provides an unlock signal on line 26 fed to the controller 22.

The interface unit 10 of FIG. 1 is intended as a low voltage interface for communication with low voltage devices, such as hearing assisting devices, for example. The interface unit 10 uses three levels of current for data and synchronization. More specifically, a synchronization pulse is represented by a 100 µA current pulse and a current generator 28 is provided that provides a 100 µA current. On the other hand, data representing a "0" during the read operation is represented by −30 µA and data "1" is represented by +30 µA. Thus, the two current generators 30 and 32 provide these values. On the other hand, during writing a −30 µA pulse represents a data "0" and a +30 µA pulse represents "1". In order to indicate an inactive state, an inactive pulse of 1 µA is provided by the current generator 34.

The programmer unit should be synchronized to the clock of the device being programmed and a timing circuit 36 connected to the clock signal of the hearing assisting device is provided to accomplish that. Operation of this timing device 36 will be explained in detail below.

Figure 2:
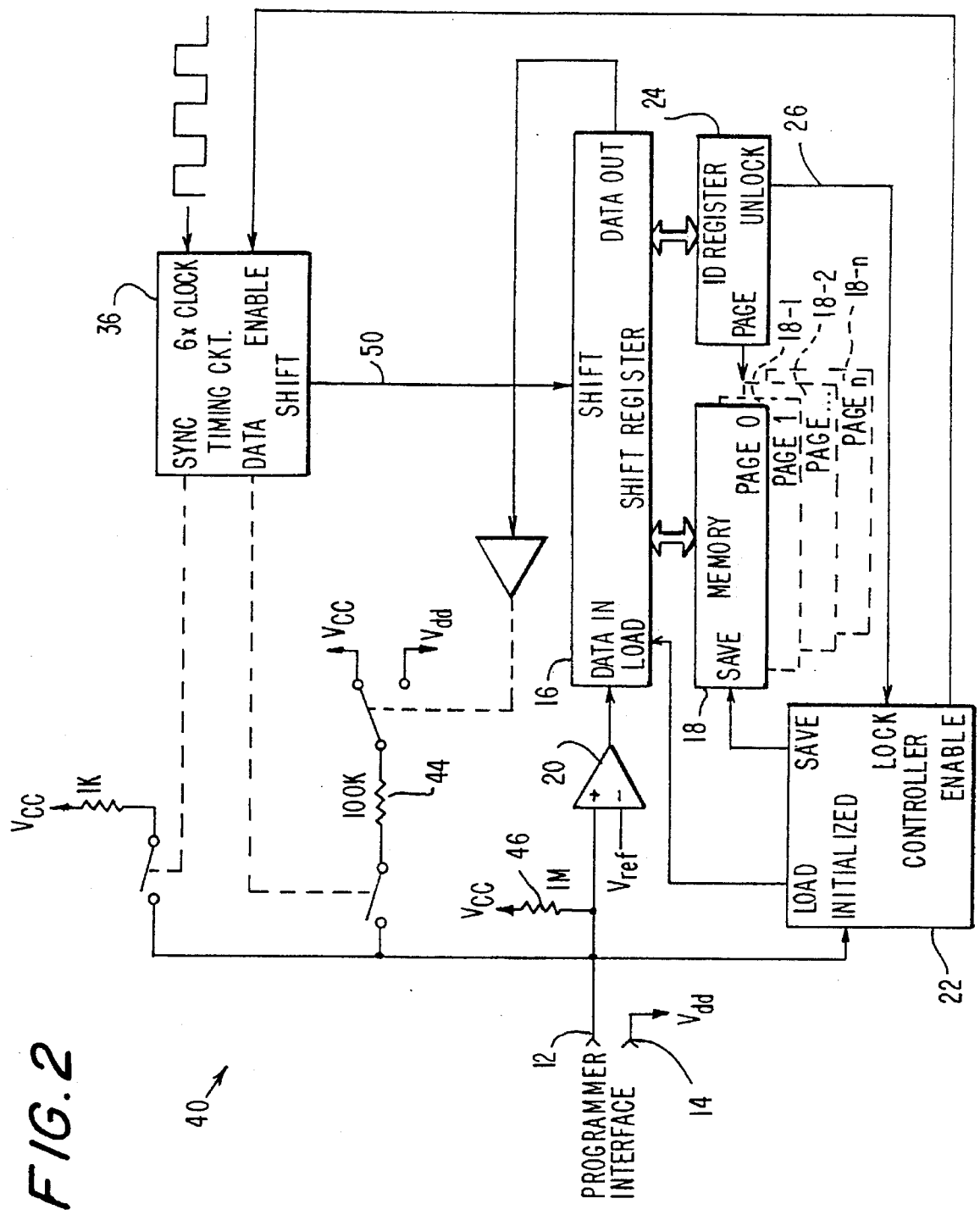
FIG. 2 is a schematic in block diagram form of a second embodiment according to the present invention.

FIG. 2 represents an interface unit 40 that is intended for communication with high-voltage devices, such as remote control units. The interface unit 40 therefore utilizes impedance as the data carrier and operates at from three to five volts. Although not shown in FIGS. 1 or 2, the interface unit has an internal battery that provides Vcc and Vdd at respective terminals. More particularly, the synchronization pulse during reading is from 1K to Vcc and during reading data "0" is 100K to Vdd and data "1" is 100K to Vcc. Therefore, a 100K resistor 44 is provided and during writing a data "0" is 10K to 0 volts and data "1" is 10K to 5 volts. The inactive state is represented by a high impedance 1M to Vcc as provided by a resistor 46. All of the other circuit elements in this high voltage interface unit 40 are the same as the low voltage interface unit 10 of FIG. 1 and the same reference numerals are employed.

The operation of both the low voltage interface unit 10 and high voltage interface unit 40 is identical, so that the following discussion is relative to both of these units.

Figure 3:
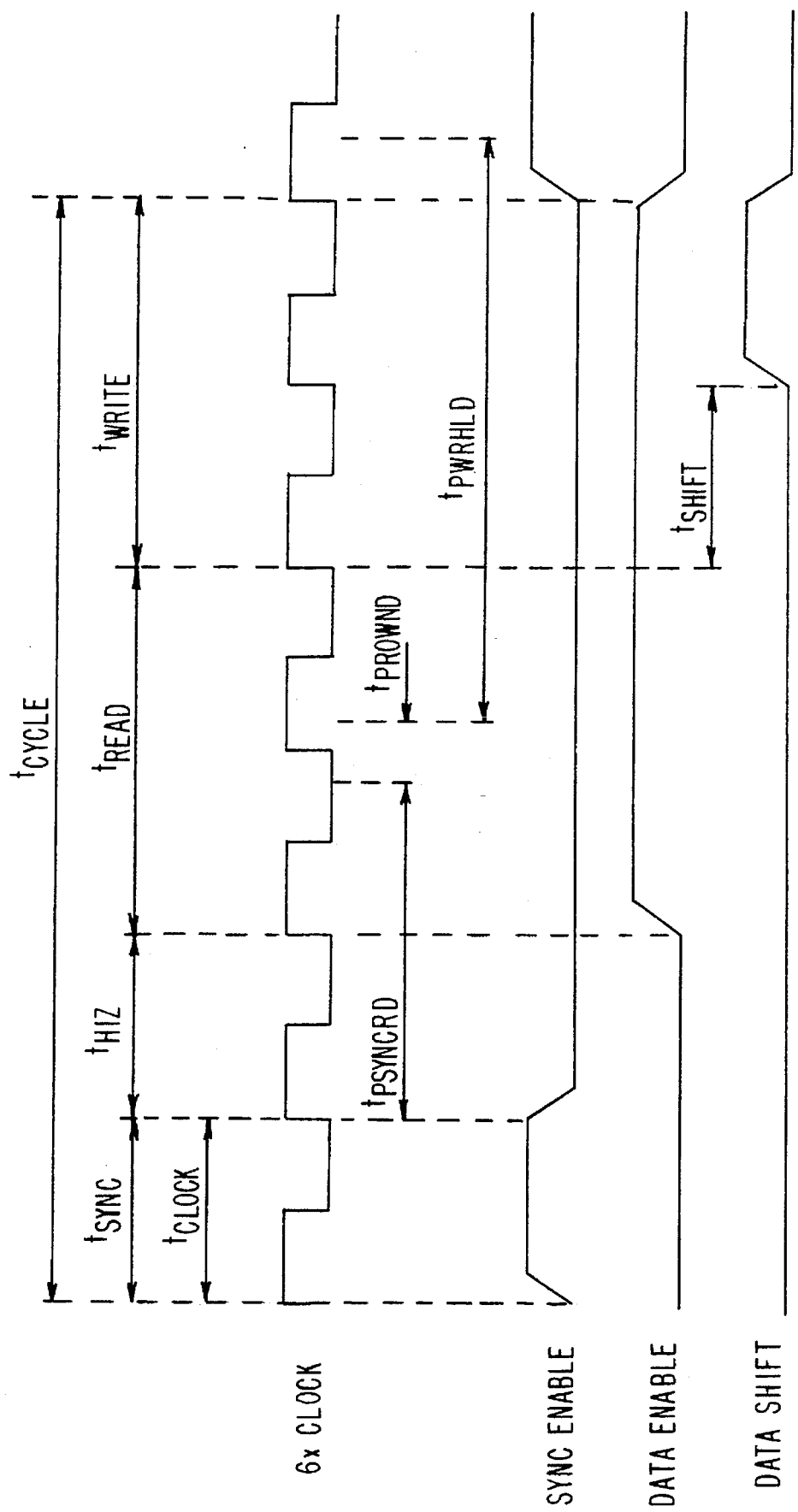
FIG. 3 is a timing chart of a data bit cycle as present in the embodiments of FIGS. 1 and 2.

The operation of the interface units is based upon and centered around the circular data buffer as represented by shift register 16. Upon initialization, which is noted by a pulse appearing at contact 12 from the programmer unit and fed to the initialize input of the controller 22, the data from the memory 18 is loaded into the circular shift register 16. This data is then shifted through the circular shift register 16 under control of the timing circuit 36 by the signal on line 50 fed to the shift input of the shift register 16. The data is shifted through the shift register 16 and exposed to the programmer unit (not shown) connected to terminals 12 and 14 one bit at a time. The programmer unit then may read and write these data bits. As shown in FIG. 3, each data bit is preceded by a synchronization pulse that synchronizes the write time. When all data bits have been shifted through the shift register 16, the data is placed back into the memory 18.

The data protocol is independent of the type of interface employed and each device communication cycle contains device data and control bits. Typically, the first four bits are address or control bits. Device data contains the information relating to the operation of the device, that is, the desired end result of the programming operation. The device control information, on the other hand, is used to control the flow of data and the operation of the interface unit itself. All of this data is shifted as explained above past the programmer unit one bit at a time. All bits are presented in the same form as defined by the bit cycle described below.

FIG. 3 relates to that bit cycle, and the data bit cycle is broken down into three phases. These phases are the synchronization phase, the data read phase, and the data write phase. All of these so-called phases are controlled by the timing circuit 36 by means of a clock signal running at six times the bit rate. This timing is shown at FIG. 3. As explained hereinabove, both of the interface units 10 and 40 have four output levels associated with each phase. The synchronization phase has the highest electrical level as seen above, and this is sufficient to distinguish it from the data phases. The data phase has two levels, each representing the logical state of the data. Both data levels can be pulled to the inverse level during the write phase. The fourth level is represented by the low or high impedance state. As seen from FIG. 3, the sync enable pulse marks the beginning of the bit cycle and, as noted above, the high level makes it easily distinguishable from the data operation. A sync enable pulse is present only during the one clockcycle of the 6X clock. This represents the first half of its phase and the second half is a high impedance state, so that the synchronization pulse can be easily located. As shown in FIG. 3, the data read operation is provided at the middle of the cycle and is enabled by the data enable pulse. The third phase of data operation is when the data on the programming pin 12 of FIGS. 1 and 2 is shifted back into the shift register, which occurs at the rising edge of the sixth clock cycle of the 6X clock signal from the timing circuit 36.

The first 8, 12, or 16 bits output may be used for device control. The particular one of these three numbers of bits is selected based upon the first two bits of the output during the read phase. For example, if the first two bits are "1 and 0" then 12 bits may be selected for device control. On the other hand, during the write phase the first four bits are used for device addressing or command input. The remaining bits are the identification code and the security lock as read into the ID register 24. In that regard, the ID code is used to identify the product type or the specific IC device and is represented by a series of bits specifically chosen to permit that function. If the code identifies a product type then there must exist in the data memory 18 another product code for identification. The purpose of such identification code is to permit the programmer to determine the format of the device data required. On the other hand, the security code is the inverse of the identification code. This means that when the identification code is being read, its inverse is written back to protect against false communications with the device. Thus, device data is presented at the programming pin 12 only after a valid security code has been received. The data may be any length from 1 to 64 bits as explained above. The only restriction is that a product code is included in the default memory word if the identification code is not unique.

The device shown in FIGS. 1 and 2 typically is in an inactive state and the programmer can activate the device by placing a data "0" on the data line. It is advisable to provide a debounce delay to make sure this low state is not a false start and after such delay is completed and the data line is still pulled low then the first data bit cycle, as described above, is entered.

As noted above, the interface units shown in FIGS. 1 and 2 are asynchronous and the programmer unit is synchronized to the clock signal of the hearing assisting device by use of the timing circuit 36 and this is accomplished by measuring the time between the rising edges of the second and third synchronization pulses. This is shown in FIG. 3.

Figure 4:
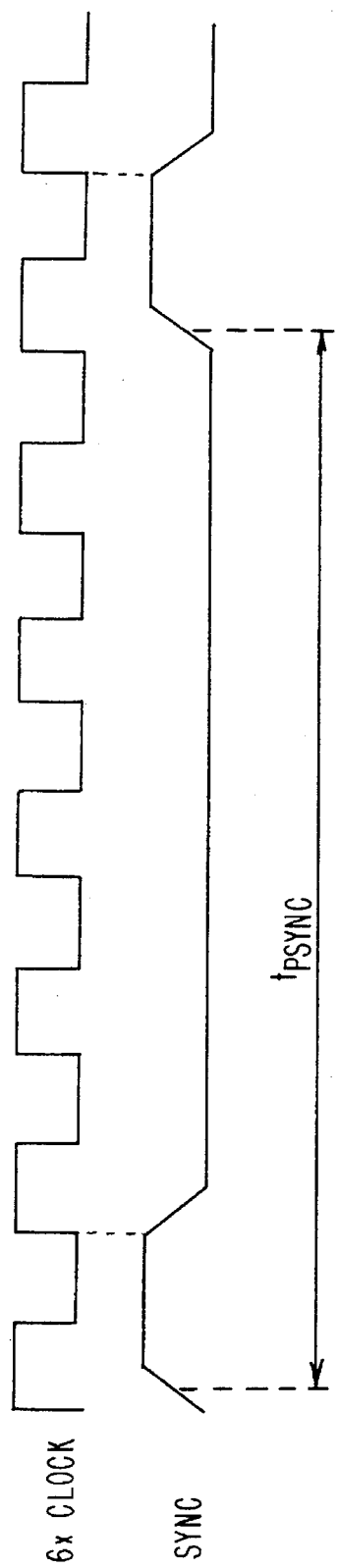
FIG. 4 is a timing diagram showing programmer unit clock recovery.

FIG. 4 shows the relationship between the device and programmer unit timing. All communication timing as explained above is based upon a virtual 6X clock that has a period equal to one sixth of the bit cycle time. For example, FIG. 4 represents the timing of the high voltage programming pulses as compared with the 6X clock.

Figure 5:
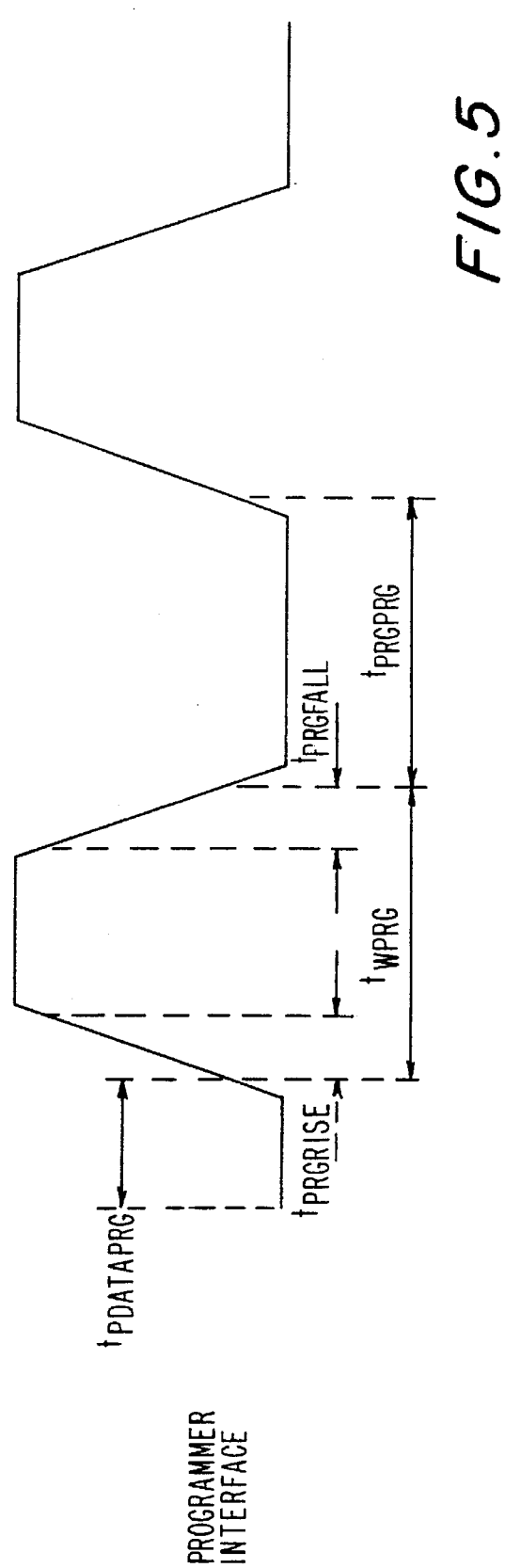
FIG. 5 is a timing diagram showing program pulse timing.

In order to permit the programmer unit to erase the electrically erasable programmable read only memory that is typically included in the device being programmed by assistance of the present invention, the programmer or operator of the programming console has the ability to supply two consecutive programming pulses to the device. The first pulse is supplied to erase the electrically erasable programmable read only memory and the second pulse is to program that read only memory. These two pulses are represented in FIG. 5 and can be a zero to 22 volt pulse with a rise time or slew rate of 1 volt per 5 μseconds.

Although the present invention has been described hereinabove with reference to the preferred embodiment, it is to be understood that the invention is not limited to such illustrative embodiment alone, and various modifications may be contrived without departing from the spirit or essential characteristics thereof, which are to be determined solely from the appended claims.

What is claimed is:

1. An interface system for providing communication between a programmable device and a programmer unit, comprising:

a memory unit containing data representing an initial program for operating the programmable device;

a circular shift register of the kind in which data contained therein can be shifted past an input terminal, said circular shift register being connected to said memory unit;

a controller connected to said memory unit and said shift register for controlling a flow of data to and from said memory unit and said circular shift register;

a timing circuit connected to said controller and to said circular shift register for controlling a rate of shifting of the data through said circular shift register; and a two-pin electrical connection for connecting the programmer unit to the circular shift register, whereby data shifted in said circular shift register is exposed bit-by-bit to the programmer unit, so as to be selectively changed.

2. An interface system according to claim 1, further comprising an identification register containing identification data identifying the programmable device and being connected to said controller and to said circular shift register, whereby the identification data is read into said circular shift register and exposed to the programmer unit for identifying the programmable device to the programmer unit.

3. An interface system according to claim 1, wherein said memory unit includes a plurality of memory pages for containing programs for operating the programmed device.

4. An interface system according to claim 1, further comprising a plurality of current sources connected to said controller and to said timing circuit, whereby low voltage current pulses are provided for communication between said controller and said timing circuit.

5. An interface system according to claim 1, further comprising a plurality of resistors connected between said controller and said timing circuit and a source of bias voltage, whereby high voltage pulses are provided for communication between said controller and said timing circuit.

* * * * *